United States Patent
John et al.

(10) Patent No.: US 11,404,601 B2
(45) Date of Patent: Aug. 2, 2022

(54) CONDUCTIVE MICRO LED ARCHITECTURE FOR ON-WAFER TESTING

(71) Applicant: Apple Inc., Cupertino, CA (US)

(72) Inventors: Ranjith Samuel E. John, Livermore, CA (US); Adam C. Abrahamsen, San Jose, CA (US); Clayton K. Chan, Fremont, CA (US); Madhan M. Raj, San Jose, CA (US); Michael Y. Chan, Sunnyvale, CA (US); Nazneen N. Jeewakhan, Santa Clara, CA (US); Yu S. Yang, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/909,672

(22) Filed: Jun. 23, 2020

(65) Prior Publication Data

US 2021/0091259 A1    Mar. 25, 2021

Related U.S. Application Data

(60) Provisional application No. 62/902,870, filed on Sep. 19, 2019.

(51) Int. Cl.
| | |
|---|---|
| *H01L 33/00* | (2010.01) |
| *H01L 21/683* | (2006.01) |
| *H01L 21/66* | (2006.01) |
| *H01L 25/075* | (2006.01) |
| *H01L 33/62* | (2010.01) |

(52) U.S. Cl.
CPC ...... *H01L 33/0095* (2013.01); *H01L 21/6835* (2013.01); *H01L 22/12* (2013.01); *H01L 22/32* (2013.01); *H01L 25/0753* (2013.01); *H01L 33/62* (2013.01); *H01L 2221/68354* (2013.01); *H01L 2221/68363* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 10,424,493 B2 | 9/2019 | Hu et al. | |
| 10,573,544 B1* | 2/2020 | Radauscher | H01L 22/20 |
| 10,734,269 B1 | 8/2020 | Golda et al. | |
| 2014/0084240 A1* | 3/2014 | Hu | H01L 27/156 257/13 |
| 2015/0076528 A1* | 3/2015 | Chan | H01L 24/97 257/88 |
| 2015/0187991 A1* | 7/2015 | McGroddy | H01L 33/30 257/13 |
| 2017/0063028 A1* | 3/2017 | Leobandung | H01S 5/0287 |
| 2019/0198564 A1* | 6/2019 | Tandon | F21S 41/153 |
| 2021/0125748 A1* | 4/2021 | Boscher | C09D 7/70 |

* cited by examiner

*Primary Examiner* — Ratisha Mehta
(74) *Attorney, Agent, or Firm* — Aikin & Gallant, LLP

(57) ABSTRACT

LED donor substrates and conductive architectures for on-wafer testing are described. In an embodiment, an array of LEDs is supported by an array of electrically conductive stabilization posts. The electrically conductive stabilization posts can be coupled with a test pad for on-wafer testing prior to transferring the LEDs to a receiving substrate.

12 Claims, 11 Drawing Sheets

CONDUCTIVE MICRO LED ARCHITECTURE FOR ON-WAFER TESTING

RELATED APPLICATIONS

This application claims the benefit of priority of U.S. Provisional Application No. 62/902,870 filed Sep. 19, 2019, which is incorporated herein by reference.

BACKGROUND

Field

Embodiments described herein relate to micro devices. More particularly embodiments relate to conductive stabilization structures for testing of micro devices on a donor substrate.

Background Information

State of the art displays for electronic devices such as wearable devices, portable electronics, desktop computers, and televisions are based on liquid crystal display (LCD) or organic light emitting diodes (OLED) technologies. More recently, it has been proposed to incorporate emissive inorganic semiconductor-based micro LEDs into high resolution displays, with the potential for energy efficiency and being less prone to lifetime degradation and sensitivity to moisture.

In one implementation, it has been proposed to transfer an array of inorganic semiconductor-based micro LEDs from a carrier substrate to a receiving (e.g. display) substrate using an array electrostatic transfer heads. For example, it has been proposed in U.S. Pat. No. 8,835,940 to stage an array of micro LEDs on an array of stabilization posts formed of an adhesive bonding material, such as a thermoset material. During the transfer process, it is described that the array of electrostatic transfer heads generate a sufficient pressure to overcome the adhesion strength between the adhesive bonding material and the micro LEDs.

SUMMARY

LED donor substrates and conductive architectures for on-wafer testing are described. In an embodiment a donor substrate includes a carrier substrate and a stabilization layer including a plurality of pillars formed of a non-metallic matrix material including an organic-based or inorganic-based backbone. A metallic liner layer is over the plurality of pillars, where the metallic liner layer and the plurality of pillars form a plurality of stabilization posts. An array of LEDs is supported by the array of stabilization posts, each LED including a bottom metal contact layer in direct contact with the metallic liner layer.

In an embodiment a donor substrate includes a carrier substrate, a bonding layer on the carrier substrate, and a metal adhesion layer on the bonding layer. A stabilization cavity layer is on the metal adhesion layer, with the stabilization cavity layer including an array of stabilization cavities. An array of via openings are through the stabilization cavity layer. An array of LED devices is at least partially contained within the array of stabilization cavities, each LED device including a p-n diode, a bottom contact structure, and a metal stabilization post. The metal stabilization posts each protrude from the bottom contact structure, extending through a corresponding via opening and in direct contact with the metal adhesion layer.

In an embodiment a donor substrate includes a carrier substrate and an array of LEDs supported on the carrier substrate with an array of stabilization posts. A (e.g. bottom electrode) test pad is on the carrier substrate and is electrically coupled to a portion of stabilization posts of the array of stabilization posts. In an embodiment a local (e.g. top electrode) test pad is electrically coupled with top conductive contacts of a group of test LEDs in the array of LEDs.

In an embodiment, a method of populating a display panel includes probing one or more test LEDs, which may be LEDs also eligible for transfer, within a first area of a donor substrate to determine operability of the one or more test LEDs. A first group of LEDs can then be picked up from the first area of the donor substrate and placed onto a receiving substrate depending upon the probing results.

DETAILED DESCRIPTION

Figure 1:
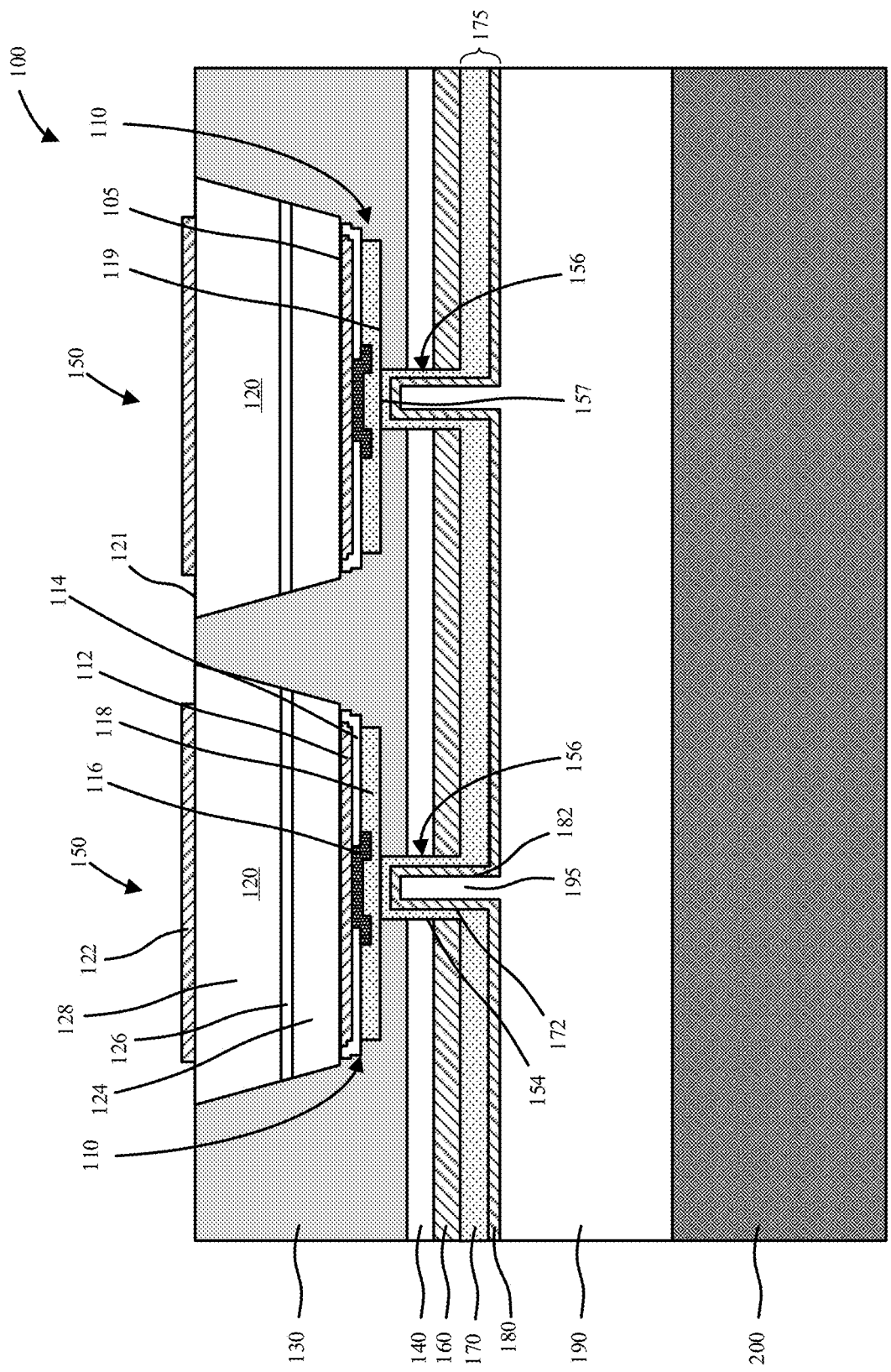
FIG. 1 is a schematic cross-sectional side view illustration of a donor substrate including a plurality of LEDs supported on a plurality of stabilization posts in accordance with an embodiment.

Embodiments describe donor substrates and conductive micro LED architectures thereof that facilitate testing of the micro LEDs prior to transferring the micro LEDs from the donor substrate to a receiving substrate. In particular, embodiments describe electrically conductive stabilization structures that may function to both support and retain the micro LEDs on the donor substrate, while also providing electrical connection for testing of the micro LEDs to verify operability prior to being transferred to and integrated on a display substrate.

It has been observed that display panels fabricated using techniques involving micro LED transfer can be prone to the inclusion of defects with the integrated micro LED devices. Such defects can occur from a variety of sources related to the transfer process, integration process, or the micro LEDs themselves on the donor substrate. In this aspect, embodiments described herein allow for testing of the micro LEDs while on the donor substrate and prior to being transferred to a receiving substrate.

While embodiments are described with specific regard to micro LED devices comprising p-n diodes, it is to be appreciated that embodiments of the invention are not so limited and that certain embodiments may also be applicable to other micro devices which are designed in such a way so as to perform in a controlled fashion a predetermined electronic function (e.g. diode, transistor, integrated circuit, display circuitry, sensor) or photonic function (LED, laser). Embodiments are also applicable to micro chips.

The terms "micro" device, "micro" mesa, "micro" chip, or "micro" LED device as used herein may refer to the descriptive size of certain devices, chips, or structures in accordance with embodiments of the invention. As used herein the term "micro device" specifically includes "micro LED device" and "micro chip". As used herein, the terms "micro" devices or structures are meant to refer to the scale of 1 to 300 µm. In an embodiment, a single micro device or structure has a maximum dimension, for example length or width, of 1 to 300 µm, or 1 to 100 µm. In an embodiment, the top contact surface of each micro device, micro structure, or electrostatic transfer head has a maximum dimension of 1 to 300 µm, 1 to 100 µm, or more specifically 1 to 20 µm, or 1 to 10 µm.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a schematic cross-sectional side view illustration is provided of a donor substrate including a plurality of LEDs supported on a plurality of stabilization posts in accordance with an embodiment. As shown in FIG. 1, the donor substrate 100 can include a carrier substrate 200 and a stabilization layer 190. The stabilization layer 190 includes a plurality of pillars 195 formed of a non-metallic matrix material including a carbon-based or oxygen-based backbone. A metallic liner layer 175 is over the plurality of pillars 195. Together, the metallic liner layer 175 and the plurality of pillars 195 form a plurality of stabilization posts 156 which can support an array of LEDs 150, which may be micro LEDs. As shown, each LED 150 includes a bottom metal contact layer 118 in direct contact with the metallic liner layer 175.

A variety of additional layers can be formed to facilitate the fabrication and transfer processes. For example, a sacrificial release layer 130 may be formed between the array of LEDs 150 and the stabilization layer 190. The sacrificial release layer 130 may be removed, for example, by a vapor hydrofluoric acid (HF) etch prior to the transfer process to render the LEDs 150 poised for pick up. An etch protection layer 140 may be located over the metallic liner layer 175. Furthermore, a metal adhesion layer 160 can be located between the etch protection layer 140 and the metallic liner layer 175. For example, this can promote better adhesion to the etch protection layer 140 than would otherwise by achieved by the metallic liner layer 175. The etch protection layer 140 may protect the metal adhesion layer 160 during removal of the sacrificial release layer 130. As shown, the plurality of stabilization posts 156 each protrude through a via opening that is formed through the metal adhesion layer 160, the etch protection layer 140, and the sacrificial release layer 130. Additionally, the metallic liner layer 175 can include a metal bonding layer 170 that is in direct contact with the bottom metal contact layer 118, and a conformal adhesion layer 180, which may be used to promote adhesion for the stabilization layer 190.

The stabilization layer 190 in accordance with embodiments may be formed of a material suitable for substrate-substrate bonding, and capable of flowing into the via opening spaces to form the pillar 195 structures which can provide mechanical support for the stabilization posts 156. Some exemplary materials include matrix materials with an organic-based (e.g. carbon-based) backbone such as benzocyclobutene (BCB), polyimide, etc. or matrix materials with an inorganic-based backbone. For example, an inorganic-based backbone may be a silicon-based backbone, or other inorganic such as boron, phosphorus, silicon-oxide, etc. Exemplary inorganic-based backbone materials include siloxanes such as polydimethylsiloxane (PDMS), spin on glass (SOG), etc. Such a base composition may be electrically insulative. In such a configuration, the metallic liner layer 175 provides electrical connection for testing of the LED 150. In an embodiment, the stabilization layer may be electrically conductive. For example, this may be achieved by dispersing electrically conductive structures in the non-metallic material, including particles such as metal particles, carbon nanotubes, graphene sheets, etc.

Embodiments described herein are compatible with a variety of different LED configurations. In the exemplary embodiment illustrated in FIG. 1, the LED 150 includes a p-n diode 120 including a top doped layer 128 doped with a first dopant type (e.g. n-type), a bottom doped layer 124 doped with a second dopant type (e.g. p-type) opposite the first dopant type, and an active layer 126 therebetween. For example, the active layer may include one or more quantum well layers separated by barrier layers.

The LED 150 may include a top conductive contact 122 and bottom contact structure 110. In an exemplary embodiment, the top conductive contact 122 is formed of a transparent material, such as a transparent conductive oxide (TCO) such as indium-tin-oxide. The bottom metal contact layer 118 may be a part of a more complex bottom contact structure 110. FIG. 1 illustrates an exemplary bottom contact structure 110, though embodiments are not so limited, and may be compatible with a variety of alternative configurations of a bottom contact structure 110. In the exemplary embodiment illustrated the bottom contact structure can include a conductive layer 112 on the bottom surface 105 of the p-n diode 120. For example, the conductive layer 112 may be used to provide ohmic contact to the p-n diode 120.

In an embodiment, the conductive layer 112 is formed of a transparent conductive oxide (TCO) such as indium-tin-oxide (ITO). An insulating layer 114 such as an oxide (e.g. $Al_2O_3$) or nitride (e.g. SiNx) can be formed over and around the conductive layer 112 and patterned to form an opening that exposes the conductive layer 112. Insulating layer 114 may be formed of the same material as etch protection layer 140 to also protect against HF attack. A metal stack 116 is then formed over the insulating layer 114 and within the opening in the insulating layer to contact the conductive layer 112. The metal stack 116 may include a number of combinations of layers such as a contact layer, mirror layer, barrier layer, and interface layer, though not all layers are required, and different layers may be included. For example, a metal stack 116 may include a first contact layer for ohmic contact, a mirror layer on the first contact layer, and a barrier layer on the mirror layer to prevent diffusion. Various adhesion layers may be formed between any of the layers within the layer stack. In an embodiment, contact layer is formed of a high work-function metal such as nickel. In an embodiment, a mirror layer such as silver or aluminum is formed over the contact layer to reflect the transmission of the visible wavelength emitted from the p-n diode 120. In an embodiment, platinum is used as a diffusion barrier to bottom metal contact layer 118.

Bottom metal contact layer 118 may be formed of a variety of materials that can be chosen for bonding to the receiving substrate and/or to achieve the requisite tensile strength or adhesion or surface tension with the stabilization posts. In an embodiment, the bottom metal contact layer 118 is formed of a conductive material (both pure metals and alloys) that can diffuse with a bonding layer (e.g. gold, indium, or tin) on a receiving substrate and is also amenable to forming a metal-to-metal joint with the metallic liner layer 175. While embodiments are not limited to specific metals, exemplary materials for bottom metal contact layer 118 include gold and aluminum, as well as their alloys.

The metallic liner layer 175 can include a metal bonding layer 170 that is in direct contact with the bottom metal contact layer 118, and a conformal adhesion layer 180, which may be used to promote adhesion for the stabilization layer 190. While embodiments are not limited to specific metals, exemplary materials for metal bonding layer 170 include gold and aluminum, as well as alloys in which elemental impurities can be added to tailor mechanical properties (e.g. yield strength, hardness, ductility) of the metal-to-metal joint. Exemplary elemental impurities that may be included are Co, Ni, Be, Al, Ca, Mo, Au. In an embodiment, a gold alloy material includes 0 to 5% by weight of impurity. The bottom metal contact layer 118 may additionally be formed of any of these materials. While embodiments are not limited to specific metallic materials, exemplary materials for conformal adhesion layer 180 include Ti, TiW, Cr and Ni. Conformal adhesion layer 180 may also be selected to control joint adhesion, and additionally the break point during the transfer process. Geometry of the stabilization posts 156 may also be varied to control adhesion. In an embodiment, each stabilization post 156 has a maximum contact surface 157 width of less than 0.5 μm. For example, the stabilization posts 156 and resultant metal-to-metal joints may be in the form of solid posts, annular rings, etc. The number of stabilization posts 156 and location can also be adjusted to control the pull force required for transfer.

In one aspect, the dimensions and compositions of the metal bonding layer 170 and the bottom metal contact layer 118 can be tailored to achieve a reliable and repeatable bond force between the layers (e.g. pull force required for transfer).

Figure 2:
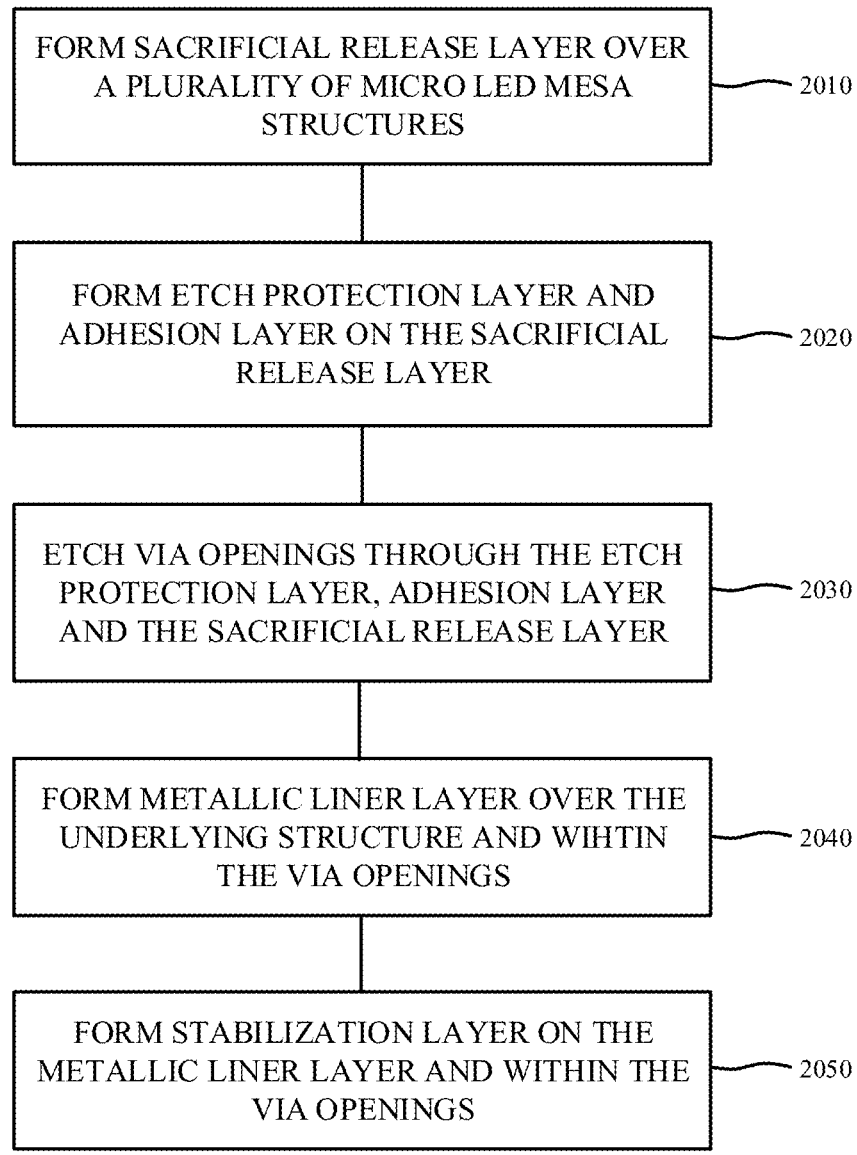
FIG. 2 is a process flow of a method of fabricating the donor substrate of FIG. 1 in accordance with an embodiment.

FIG. 2 is a process flow of a method of fabricating the donor substrate of FIG. 1 in accordance with an embodiment. FIGS. 3A-3M are schematic cross-sectional side view illustrations of a method of fabricating the donor substrate of FIG. 1 in accordance with an embodiment. In interest of clarity and conciseness, FIGS. 2 and 3A-3M are described concurrently so as to not unnecessarily obscure the embodiments.

Figure 3A:
FIGS. 3A-3M are schematic cross-sectional side view illustrations of a method of fabricating the donor substrate of FIG. 1 in accordance with an embodiment.

Referring to FIG. 3A, the processing sequence includes a p-n diode layer 104 formed on a growth substrate 102. As shown, the p-n diode layer 104 includes a first doped layer 124 doped with a first dopant type (e.g. n-type), a second doped layer 128 doped with a second dopant type (e.g. p-type) opposite the first dopant type, and an active layer 126 between the doped layers 124, 128. The active layer 126 may include one or more quantum well layers separated by barrier layers. In accordance with embodiments, the p-n diode layer 104 may be formed of III-V or II-VI inorganic semiconductor-based materials, and be designed for emission at a variety of primary wavelengths, such as red, green, blue, etc.

Figure 3B:
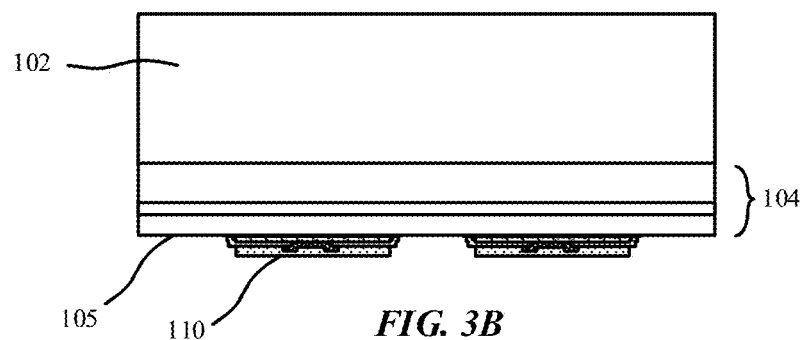
Figure 3C:
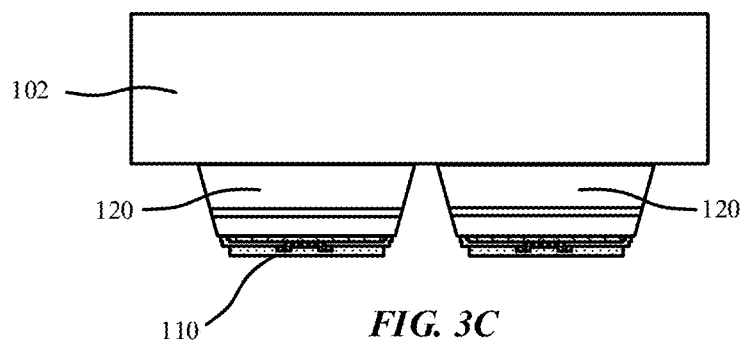
Figure 3D:
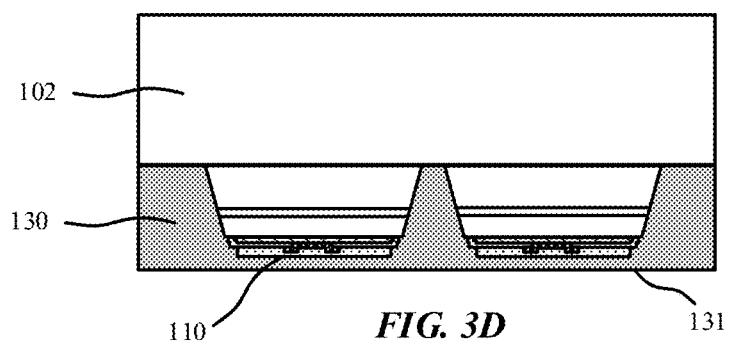

An array of laterally separate bottom contact structures 110 are then formed on the doped layer 124 as illustrated in FIG. 3B. As previously described with regard to FIG. 1, the bottom contact structures 110 may include multiple layers, such as a conductive layer 112 for ohmic contact, a metal stack 116, and a bottom metal contact layer 118. Referring now to FIG. 3C, the p-n diode layer 104 is etched to form an array of mesa structures that will become the p-n diodes 120. In an embodiment, etching is performed using dry etching technique. Alternatively, the array of mesa structures can be etched prior to formation of the bottom contact structures 110.

In an embodiment, a sacrificial release layer 130 is then formed over the plurality of micro LED mesa structures (p-n diodes 120) at operation 2010. The sacrificial release layer 130 may be formed using a variety of configurations. For example, in the embodiment illustrated in FIG. 3D, the sacrificial release layer 130 may be used as a planarization layer as well. In such an embodiment, the sacrificial release layer 130 may be deposited, followed by a planarization operation to form a planarized surface 131. The sacrificial release layer 130 may completely cover the micro LED mesa structures and bottom contact structures 110. Alternatively, the sacrificial release layer 130 may be a conformal layer, with more uniform thickness. Such a processing condition can be used to from the structures of FIGS. 4-5 where the LEDs 150 will be at least partially contained within a staging cavity.

In an embodiment, sacrificial release layer 130 is formed of an oxide (e.g. $SiO_2$) or nitride (e.g. $SiN_x$), though other materials may be used which can be selectively removed with respect to the other layers. In the illustrated in embodiment, the sacrificial release layer 130 is thicker than the mesa structures forming the p-n diodes 120. For example, the sacrificial release layer 130 may be 2-5 μm thick. In an embodiment that results in staging cavities, the sacrificial release layer 130 may be thinner than the mesa structures forming the p-n diodes 120. In such an implementation the sacrificial release layer 130 is between approximately 0.1 and 2 μm thick, or more specifically approximately 0.2 μm thick.

Figure 3E:
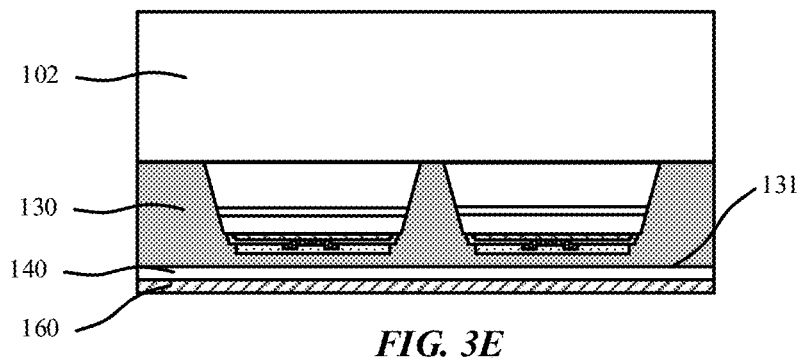

Referring now to FIG. 3E, at operation 2020 an etch protection layer 140 is formed on the sacrificial release layer 130, for example, on planarized surface 131. The etch protection layer 140 may be formed of a material which is resistant to the etchant used to remove the sacrificial release layer 130. In this manner, the etch protection layer 140 can be used to protect underlying materials from the etchant. In an embodiment, etch protection layer 140 is formed of a material such as $Al_2O_3$, amorphous silicon, $HfO_2$, $ZrO_2$, and $Al_xHf_yO_z$. Still referring to FIG. 3E, a metal adhesion layer 160 can then optionally be formed on the etch protection layer 140. The optional metal adhesion layer 160 may be formed of a material suitable to improve adhesion of the metallic liner layer 175 that will be formed next. For example, the metal adhesion layer 160 can be formed of titanium (Ti), which may have better adhesion to the etch protection layer 140 than materials chosen for the metallic liner layer 175. Other suitable materials for the metal adhesion layer 160 include Cr, Ni, Mo, Ta, Nb, Pt, TiW, and NiCr alloy. It has been observed that material used to form the metal adhesion layer 160 (e.g. Ti) can migrate when exposed to HF, and the etch protection layer 140 can protect the metal adhesion layer 160 during removal of the sacrificial release layer 130.

In the illustrated embodiments, the etch protection layer 140 and metal adhesion layer 160 are continuous layers, blanket deposited over the underlying substrate structure. In an embodiment, the metal adhesion layer 160 is 1 nm to 500 nm thick. The metal adhesion layer 160 may be deposited using suitable techniques such as evaporation, sputtering, electroless plating and electroplating. In an embodiment, the etch protection layer 140 is 1 nm to 100 nm thick. The etch protection layer 140 may be deposited using a suitable technique such as chemical vapor deposition (CVD), or atomic layer deposition (ALD) for a higher quality protection layer.

Figure 3F:
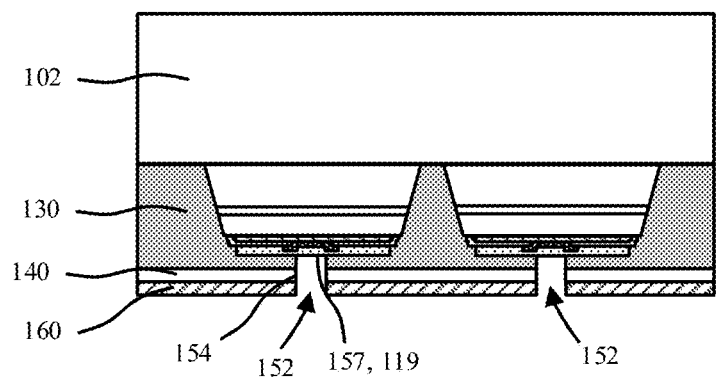

Referring now to FIG. 3F, at operation 2030 a plurality of via openings 152 are formed through the metal adhesion layer 160, etch protection layer 140 and sacrificial release layer 130 to expose the plurality of bottom contact structures 110, or more specifically the bottom surface 119 of the bottom contact structures 110 that corresponds to the bottom metal contact layer 118. Each via opening 152 may have sidewalls 154 spanning the metal adhesion layer 160, etch protection layer 140 and sacrificial release layer 130. In accordance with embodiments, the width and shape of the via openings 152 determines the resultant contact area of the stabilization posts to be formed, and resultant adhesion strength for the LEDs. In an embodiment, the via openings 152 have a maximum width between 100 nm and 1,000 nm, such as approximately 200 nm-500 nm wide.

Figure 3G:
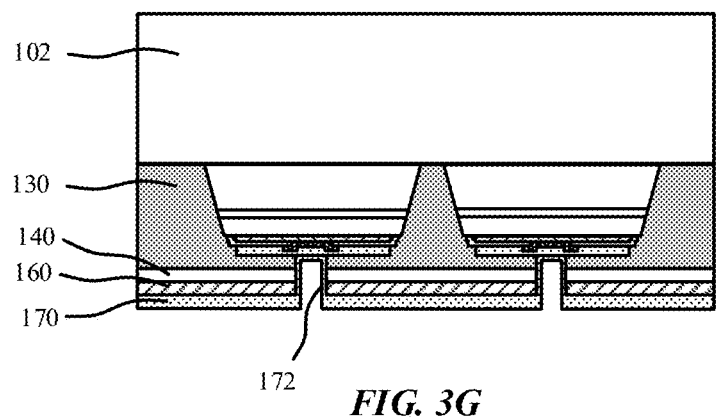

A metallic liner layer 175 is then formed over the underlaying structure and within the via openings 152 at operation 2040. Specifically, the metallic liner layer 175 is formed over the optional metal adhesion layer 160 and within the via openings 152, on the sidewalls 154 and bottom surface 119 of the bottom contact structures 110. The metallic liner layer 175 may include one or more layers. In an embodiment the metallic liner layer 175 includes a metal bonding layer 170 and conformal adhesion layer 180, which can be sequentially deposited. Referring now to FIG. 3G, the metal bonding layer 170 can be a conformal layer deposited in direct contact with the underlying optional metal adhesion layer 160 and within the via openings 152, in direct contact with the sidewalls 154 and bottom surface 119 of the bottom contact structure 110. The top surface of the metal bonding layer 170 in contact with the bottom surface 119 of the bottom contact structure 110 forms the top contact surface 157 of the resultant stabilization posts 156. A metal-to-metal joint is formed between the metal bonding layer 170 and the bottom metal contact layer 118, which may be formed of similar materials. For example, the metal bonding layer 170 and the bottom metal contact layer 118 may each include a same base metal element, such as Au or Al. In an embodiment, each layer is formed of Au or an Au alloy. Element impurities can additionally be added to either layer to tailor mechanical properties (e.g. yield strength, hardness, ductility) of the metal-to-metal joint. Exemplary elemental impurities that may be included are Co, Ni, Be, Al, Ca, Mo, Au. In an embodiment, a gold alloy material includes 0 to 5% by weight of impurity.

Figure 3H:
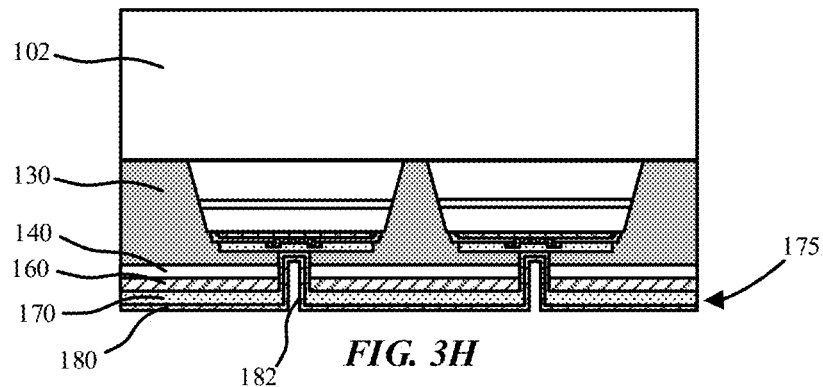

In an embodiment, the metal bonding layer 170 is 1 nm to 250 nm thick. Such a thickness may allow for conformal deposition along the sidewalls 172. The metal bonding layer 170 may be deposited using suitable techniques such as evaporation, sputtering, electroless plating and electroplating. Referring to FIG. 3H, a conformal adhesion layer 180 may then be deposited as part of the metallic liner layer 175. For example, the conformal adhesion layer 180 may be formed of a material with increased adhesion relative to the bonding layer 190 compared to the metal bonding layer 170. Exemplary materials for the conformal adhesion layer 180 include Ti, TiW, Cr and Ni. In an embodiment, the conformal adhesion layer 180 is thinner than the metal bonding layer 170. In an embodiment, the conformal adhesion layer 180 is 1 nm to 5 nm thick. As shown, the conformal adhesion layer 180 is formed along the sidewalls 172 of the metal bonding layer 170 within the via openings 152.

Figure 3I:
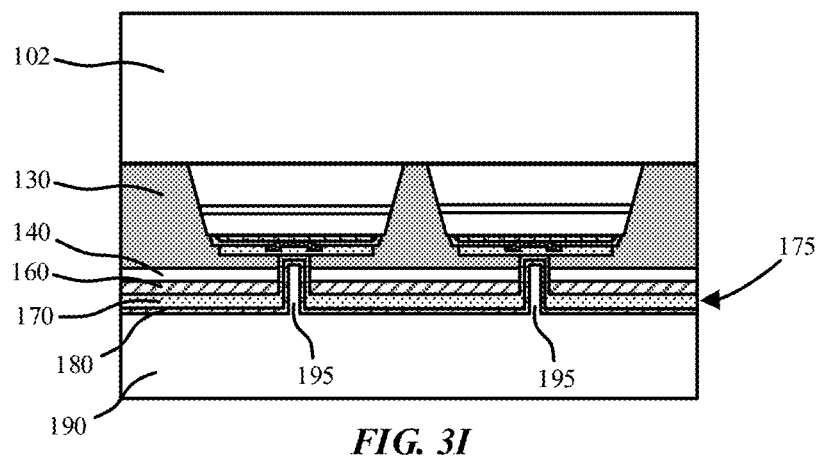

Referring now to FIG. 3I, at operation 2050 a stabilization layer 190 is formed on the metallic liner layer 175 and within volume remaining in the via openings 152. As shown, the stabilization layer 190 may be formed in direct contact with the optional conformal adhesion layer 180 and in direct contact with sidewalls 182 of the conformal adhesion layer 180 within the via openings 152. The volume of the stabilization layer 190 filling the remaining space within the via openings 152 may result in pillars 195, which can include vertical or sloped sidewalls. In the embodiment illustrated in FIG. 3I the stabilization layer 190 covers the entire surface of the underlying structure.

The stabilization layer 190 in accordance with embodiments may be formed of a material suitable for substrate-substrate bonding, and capable of flowing into the via opening spaces to form the pillar 195 structures which can provide mechanical support for the stabilization posts 156. Some exemplary materials include matrix materials with an organic-based backbone or inorganic-based backbone. Such a base composition may be electrically insulative. In such a configuration, the metallic liner layer 175 provides electrical connection for testing of the LED 150. In an embodiment, the stabilization layer may be electrically conductive. For example, this may be achieved by dispersing electrically conductive materials in the non-metallic matrix, including electrically conductive structures, including particles such metal particles, carbon nanotubes, graphene sheets, etc.

Figure 3J:
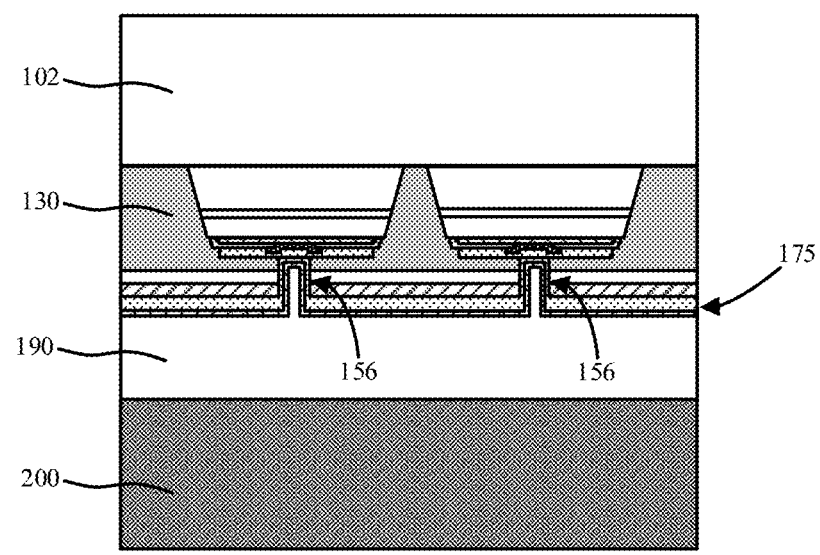
Figure 3K:
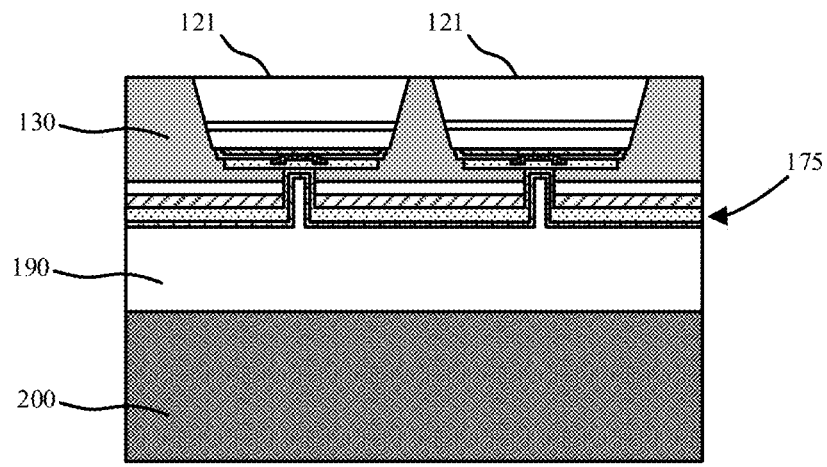
Figure 3L:
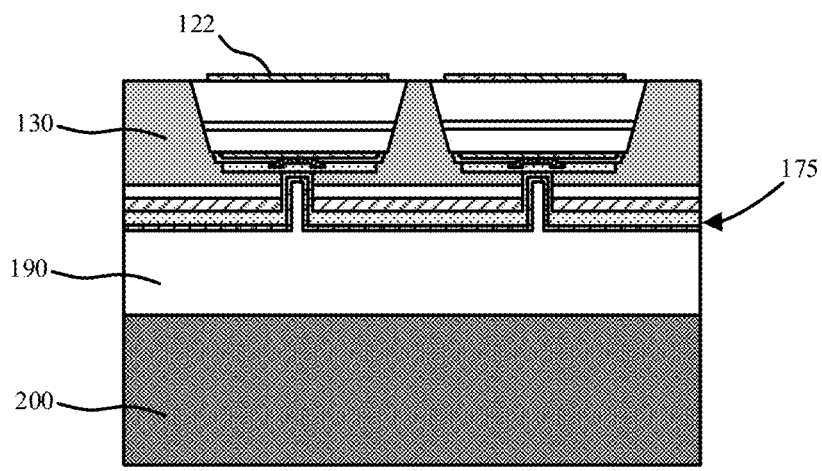

Referring now to FIG. 3J a carrier substrate 200 can be bonded using the stabilization layer 190. Carrier substrate 200 can be a variety of materials, such as a silicon, sapphire or gallium arsenide wafer, to provide mechanical support during subsequent handling and processing. The growth substrate 102 can then be removed as shown in FIG. 3K using a suitable technique such as laser lift off (LLO), or combination with grinding and polishing to expose top surfaces 121 of the p-n diodes 120. Top conductive contacts 122 can then be formed on the top surfaces 121 of the p-n diodes 120. Depending upon application, the top conductive contacts 122 can be reflective or transparent. Top conductive contacts 122 can include one or more layers, including thin metals layers and/or transparent conductive oxides (TCOs). In an embodiment, top conductive contacts 122 include ITO.

Figure 3M:
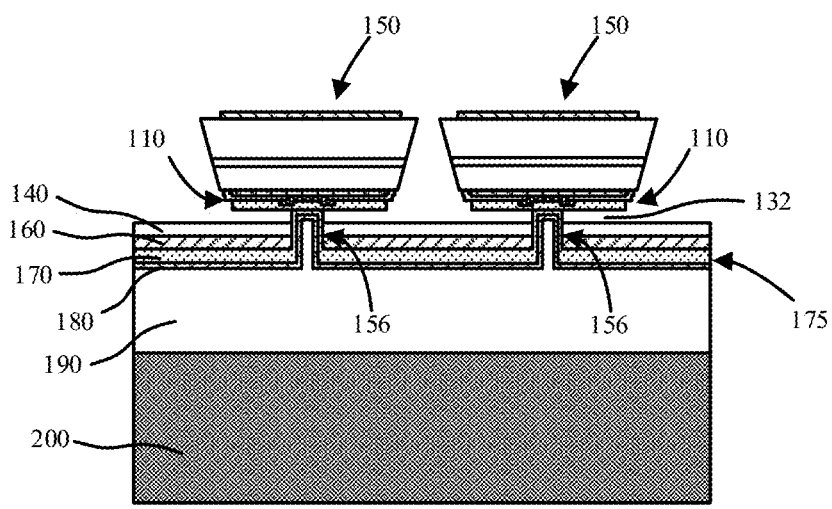

At this stage, the stabilized array of LEDs 150 are in condition for transportation or storage for future processing. Prior to transferring the LEDs 150 to a receiving substrate, for example, using a pick-and-place tool, the sacrificial release layer 130 can be removed as shown in FIG. 3M. In an embodiment, removal of the sacrificial release layer 130 may include a vapor HF etch operation. Removal of the sacrificial release layer 130 may result in an open space 132 underneath the LEDs 150, which are supported only by the stabilization posts 156.

Figure 4:
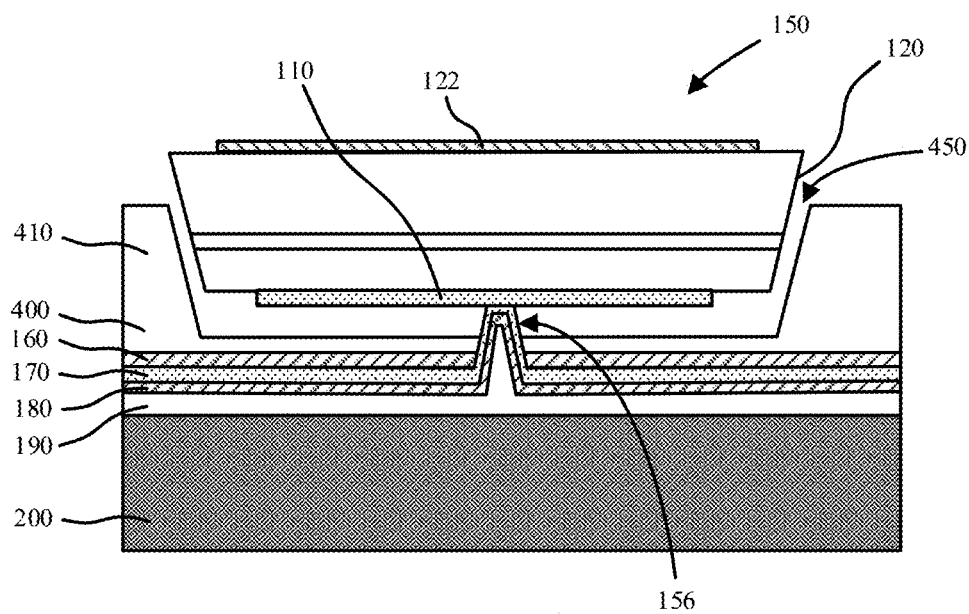
FIG. 4 is a schematic cross-sectional side view illustration of a donor substrate including an LED supported on a stabilization post within a staging cavity in accordance with an embodiment.
Figure 5:
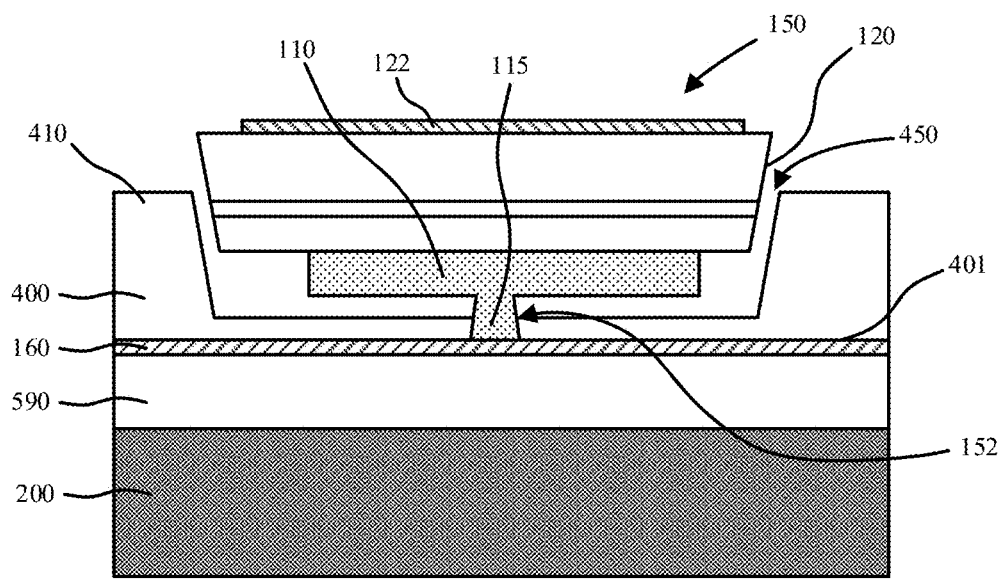
FIG. 5 is a schematic cross-sectional side view illustration of a donor substrate including an LED with an integrally formed stabilization post in accordance with an embodiment.

Referring now to FIGS. 4-5 alternative stabilization structure arrangements are illustrated for the LEDS 150. FIG. 4 is a schematic cross-sectional side view illustration of a donor substrate including an LED 150 supported on a stabilization post 156 within a staging cavity 450 in accordance with an embodiment. Specifically, the stabilization structure illustrated in FIG. 4 may be fabricated similarly as the previously described process, where after deposition of a conformal sacrificial release layer 130, with uniform thickness, a stabilization cavity layer 400 is deposited, and planarized. For example, the stabilization cavity layer 400 may be formed of the same materials as the stabilization layer 190. In such a configuration, the via openings 152 will additionally be formed through a thickness of the stabilization cavity layer 400. As shown, each LED 150 may be at least partially contained within stabilization cavities 450 including sidewalls 410 that laterally surround a portion of the thickness of the LEDs 150.

Figure 6:
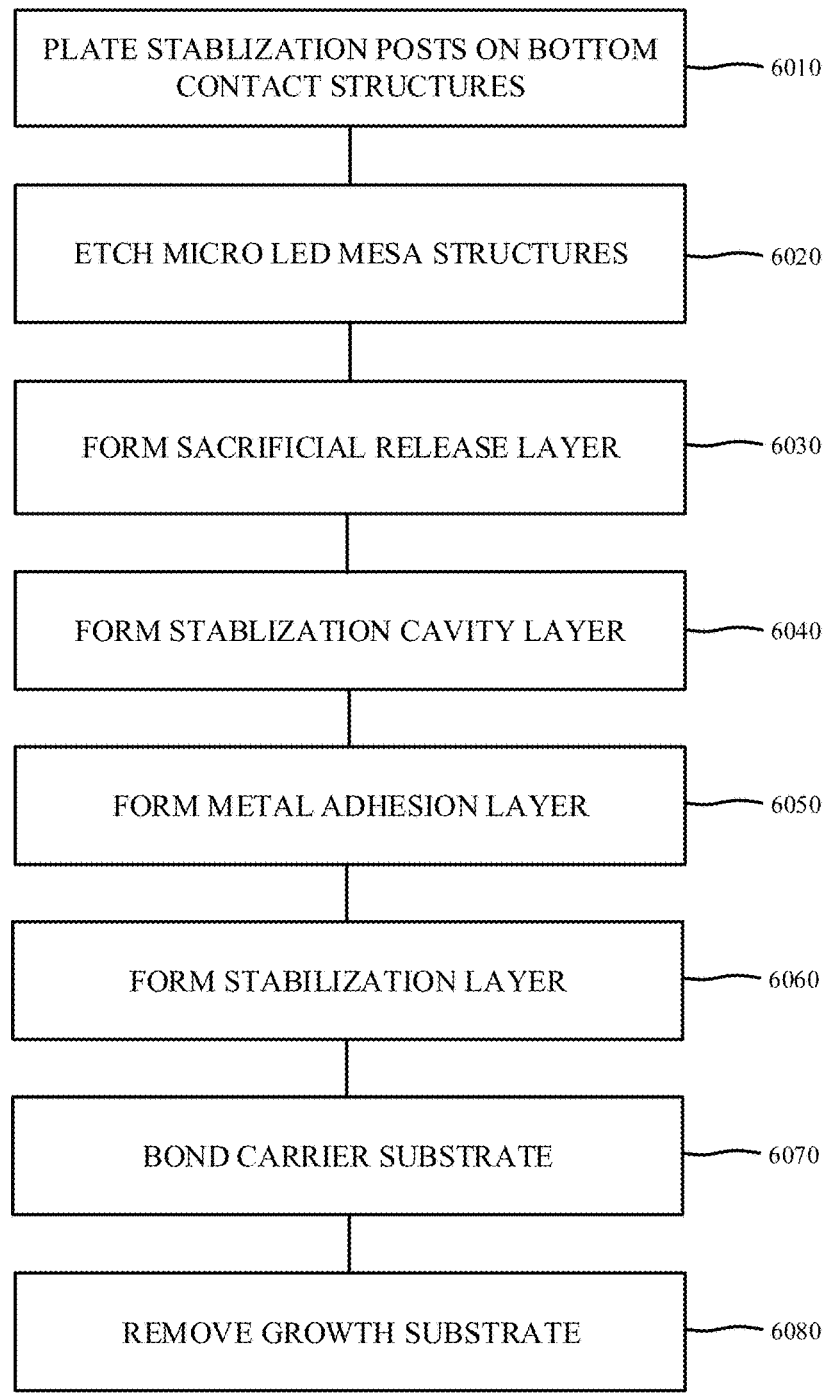
FIG. 6 is a process flow of a method of fabricating the donor substrate of FIG. 5 in accordance with an embodiment.

FIG. 5 is a schematic cross-sectional side view illustration of a donor substrate including an LED 150 with an integrally formed stabilization post 115 in accordance with an embodiment. FIG. 6 is a process flow of a method of fabricating the donor substrate of FIG. 5 in accordance with an embodiment. The process sequence may proceed similarly as the processing sequence up to FIG. 3B. At operation 6010 a plurality of stabilization posts 115 can be plated onto the corresponding bottom contact structures 110. Specifically, the stabilization posts 115 can be plated directly on the bottom contact layers 118. The array of micro LED mesa structures forming p-n diodes 120 may then be etches at operation 6020. A conformal sacrificial release layer 130 is formed at operation 6030, followed by the formation of a stabilization cavity layer 400 at operation 6040. This may include a polishing operation to planarize the bottom surface 401 of the stabilization cavity layer 400 and expose the stabilization posts 115. A metal adhesion layer 160 may then be deposited at operation 6050 to promote adhesion to the stabilization posts with the bonding layer 590 which is formed at operation 6060. Bonding layer 590 may be formed similarly and of the same materials as the stabilization layer 190 and stabilization cavity layer 400. The carrier substrate 200 can then be bonded at operation 6070, followed by removal of the growth substrate at operation 6080 as previously described.

In an embodiment, a donor substrate 100 includes a carrier substrate 200 and a bonding layer 590 on the carrier substrate 200. A metal adhesion layer 160 is on the bonding layer 590. A stabilization cavity layer 400 is on the metal adhesion layer 160, with the stabilization cavity layer including an array of stabilization cavities 450. An array of via openings extend through the stabilization cavity layer 400, with an array of LED devices 150 being at least partially contained within the array of stabilization cavities 450. As shown, each LED device 150 includes a p-n diode 120, a bottom contact structure 110, and a metal stabilization post 115 protruding from the bottom contact structure 110, extending through a corresponding via opening 152 and in direct contact with the metal adhesion layer 160. While the sacrificial release layer 130 has already been removed in the structure illustrated in FIG. 5, in an embodiment, the sacrificial release layer 130 is located between the array of LEDs 150 and the stabilization cavity layer 400, where each via opening 152 extends through the sacrificial release layer 130, and each corresponding metal stabilization post 115 extends through a corresponding via opening 152 in the sacrificial release layer 130. In accordance with an embodiment, the metal adhesion layer 160 may also be electrically conductive to support on-wafer testing of the LEDs 150.

In each of the above described structures, the arrays of LEDs 150 can be supported by an electrically conductive stabilization structure, that allows for both stabilization of the LEDs prior to being transferred, and on-wafer testing of the LEDs while still on the donor substrate 100 and prior to being transferred. This can facilitate the transfer of "known good" LEDs 150 to a receiving substrate. In some embodiments, clusters of test LEDs are provided so that good LED areas can be determined without testing each and every LEDs. In such a configuration, an inference is made for good donor wafer areas based on test data to determine a threshold evaluation for likelihood of known good LEDs being supported in a defined area.

Figure 7:
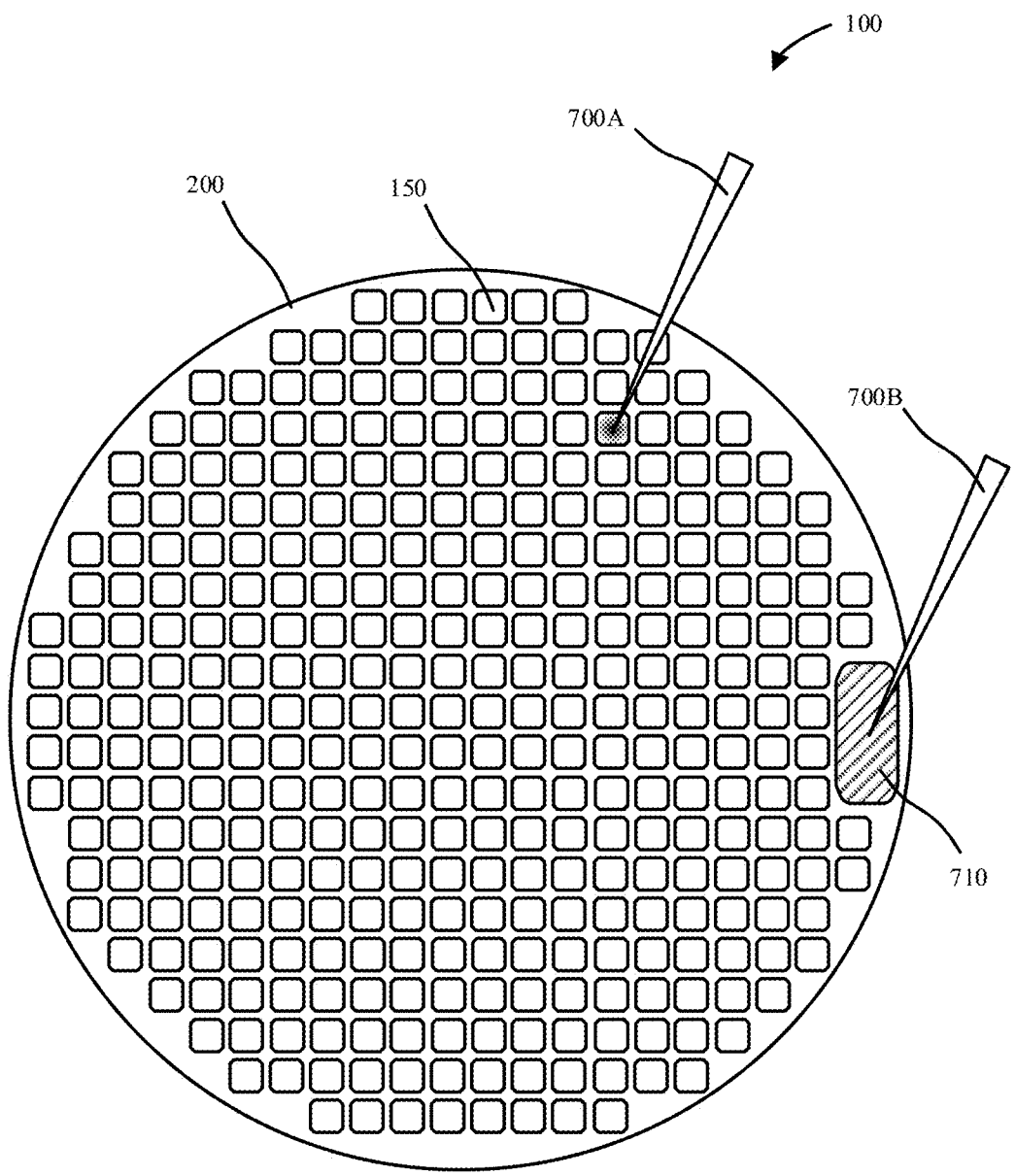
FIG. 7 is a schematic top view illustration of a donor substrate structure for probing an LED for operability in accordance with an embodiment.

FIG. 7 is a schematic top view illustration of a donor substrate structure for probing an LED for operability in accordance with an embodiment. The donor substrate 100 illustrated in FIG. 7 can have one or more (e.g. bottom electrode) test pads 710 which are electrically connected to the stabilization posts of the LEDs 150. For example, the test pads 710 can be connected to an electrically conductive layer such as the metal adhesion layer 160, metallic liner layer 175, conformal adhesion layer 180 or even an electrically conductive stabilization layer 190. As shown, a probe 700B can contact the test pad 710 while a probe tip 700A can contact an individual LED 150, such as top conductive contact 122, with the probe tip 700A at another potential or voltage level. Upon contact, an electrical circuit is completed, where an operable LED 150 will light up to indicate operability. In particular, luminance can be measured to determine whether a threshold value is obtained. Thus, each LED 150 in FIG. 7 can be a test LED.

Figure 8:
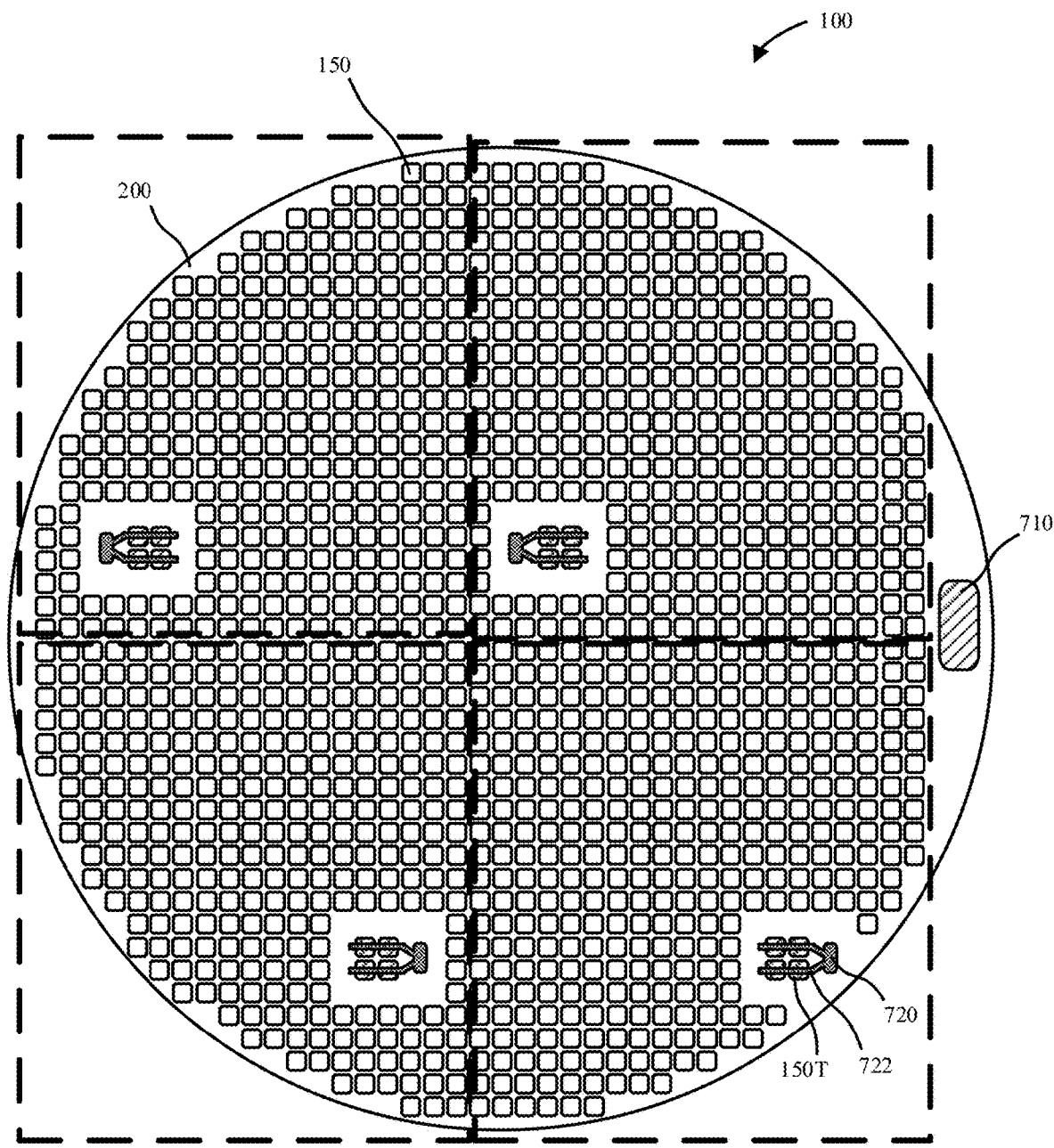
FIG. 8 is a schematic top view illustration of a donor substrate including a plurality of groups of test LEDs in accordance with an embodiment.

FIG. 8 is a schematic top view illustration of a donor substrate 100 including a plurality of groups of test LEDs 150T in accordance with an embodiment. A noticeable difference in FIG. 8 is the inclusion of permanent test LEDs 150T. In such an embodiment, a conductor pattern 722 is formed over one or more test LEDs 150T and in electrical connection with a local (e.g. top electrode) test pad 720. Such a conductor pattern 722 is not formed over the LEDs 150 that are eligible for transfer. Similar to the description of FIG. 7, probes can be connected to test pad 710 (which can also be local), and local test pad 720. A plurality of test pads 710 can be included for both FIG. 7 and FIG. 8. Completion of the circuit then lights up the one or more test LEDs 150T. The measured luminance can then be measured to determine likelihood of known good LEDs in a corresponding area of the donor substrate 100. The illustrated example of FIG. 8 shows four quadrants of corresponding areas, though this is exemplary, and any arrangement can be used.

Figure 9:
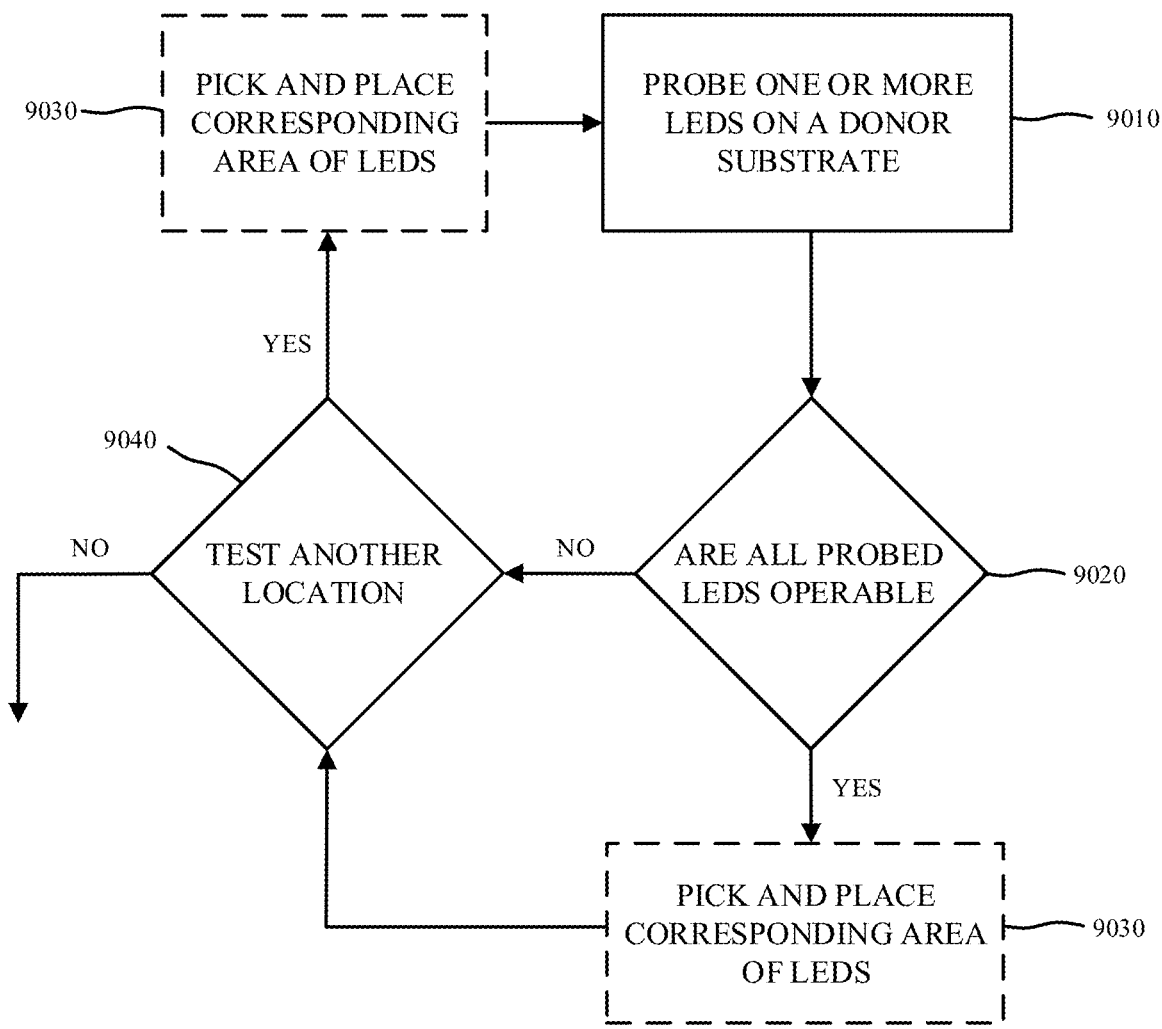
FIG. 9 is a process flow for a method of testing and transferring LEDs from a donor substrate in accordance with an embodiment.

FIG. 9 is a process flow for a method of testing and transferring LEDs from a donor substrate in accordance with an embodiment. At operation 9010 one or more test LEDs 150/150T are probed within a first area of a donor substrate to determine operability of the one or more test LEDs. At operation 9020 a determination is made whether all of the test LEDs are operable. This determination may furthermore be a threshold luminance determination. If the LEDs pass the test, then a first group of LEDs 150 is picked up from the first area of the donor substrate 200 and then placed onto a receiving substrate. A determination is then made at operation 9040 as to whether another location should be tested. And the cycle repeated. It is not necessary however to perform the transfer sequence between probing operations. For example, all probing operations can be performed prior to the pick-and-place operation 9030. The probing operation in accordance with embodiment may include probing a test pad 710 on the donor substrate while probing the one or more test LEDs. The test pad 710 in accordance with embodiments can be electrically coupled with one or more stabilization posts supporting the one or more test LEDs, and optionally the LEDs 150 that are eligible for pick-and-place if different from the test LEDs.

In utilizing the various aspects of the embodiments, it would become apparent to one skilled in the art that combinations or variations of the above embodiments are possible for forming a conductive micro LED architecture for on-wafer testing prior to transferring the micro LEDs from a donor substrate to a receiving substrate. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A donor substrate comprising:
    a carrier substrate;
    a stabilization layer including a plurality of pillars formed of a non-metallic matrix material including an organic-based backbone or inorganic-based backbone;
    a metallic liner layer over the plurality of pillars, wherein the metallic liner layer and the plurality of pillars form a plurality of stabilization posts;
    an etch protection layer over the metallic liner layer;
    a plurality of via openings extending through the etch protection layer; and
    an array of LEDs supported by the array of stabilization posts, each LED including a bottom metal contact layer in direct contact with the metallic liner layer, wherein the plurality of stabilization posts protrudes through the plurality of via openings to contact the bottom metal contact layers of the array of LEDs, and wherein a top surface of the metallic liner layer for each stabilization post is in direct contact with a bottom surface of the bottom metal contact layer for each respective LED.

2. The donor substrate of claim 1, wherein the metallic liner layer includes a metal bonding layer and a conformal adhesion layer, wherein the metal bonding layer is in direct contact with the bottom metal contact layer.

3. The donor substrate of claim 2:
    wherein the bottom metal contact layer comprises Au; and
    wherein the metal bonding layer comprises Au.

4. The donor substrate of claim 1, further comprising a sacrificial release layer between the array of LEDs and the stabilization layer, and the plurality of via openings extend through the sacrificial release layer, wherein the plurality of stabilization posts protrude through the plurality of via openings in the sacrificial release layer.

5. The donor substrate of claim 1, further comprising a metal adhesion layer between the etch protection layer and the metallic liner layer, and the plurality of via openings extend through the metal adhesion layer, wherein the plurality of stabilization posts protrude through the plurality of via openings in the metal adhesion layer.

6. The donor substrate of claim 5:
    wherein the etch protection layer comprises a material selected from the group consisting of $Al_2O_3$, amorphous silicon, $HfO_2$, $ZrO_2$, and $Al_xHf_yO_z$; and
    wherein the metal adhesion layer comprises a material selected from the group consisting of Ti, Cr, Ni, Mo, Ta, Nb, Pt, TiW, and NiCr alloy.

7. The donor substrate of claim 1, wherein the stabilization layer is electrically conductive.

8. The donor substrate of claim 1, further comprising an electrically conductive structure selected from the group consisting of particles, nanotubes and sheets dispersed in the non-metallic matrix material.

9. The donor substrate of claim 1, further comprising a test pad electrically coupled with a portion of the plurality of stabilization posts.

10. The donor substrate of claim 1, further comprising a local test pad electrically coupled with top conductive contacts of a group of test LEDs in the array of LEDs.

11. The donor substrate of claim 1, further comprising a plurality of groups of test LEDs, each group of test LEDs including a local test pad electrically coupled with top conductive contacts of the group of test LEDs.

12. The donor substrate of claim 11, further comprising:
    a sacrificial release layer between the array of LEDs and the stabilization layer;
    a metal adhesion layer between the etch protection layer and the metallic liner layer;
    wherein the plurality of via openings extend through the metal adhesion layer and the sacrificial release layer, wherein the plurality of stabilization posts protrude through the plurality of via openings in the metal adhesion layer and the sacrificial release layer; and
    wherein the metallic liner layer includes a metal bonding layer and a conformal adhesion layer, wherein the metal bonding layer is in direct contact with the bottom metal contact layer.

* * * * *